United States Patent [19]

Usui

[11] Patent Number: 5,502,431
[45] Date of Patent: Mar. 26, 1996

[54] INTEGRATED CIRCUIT DEVICE

[75] Inventor: Shinichi Usui, Tokyo, Japan

[73] Assignee: Nippon Precision Circuits Inc., Tokyo, Japan

[21] Appl. No.: 192,468

[22] Filed: Feb. 7, 1994

[30]     Foreign Application Priority Data

Mar. 4, 1993 [JP] Japan .................. 5-043747

[51] Int. Cl.⁶ .................................... H01C 1/012
[52] U.S. Cl. .................... 338/308; 338/311; 174/253
[58] Field of Search ................. 338/308, 310, 338/311, 312, 320; 257/31; 174/35 R, 253, 255; 96/38.4; 250/65, 65.1

[56]           References Cited

U.S. PATENT DOCUMENTS 3,663,224  5/1972  Hallman et al. .............. 338/308
5,270,493  12/1993 Inoue et al. .................. 174/253

FOREIGN PATENT DOCUMENTS 194682  4/1989  Japan ........................ 257/31

*Primary Examiner*—Tu Hoang
*Attorney, Agent, or Firm*—Jordan and Hamburg

[57]           ABSTRACT

An integrated circuit device includes a first insulation layer formed on a substrate; a second insulation layer formed above the first insulation layer; a thin-film resistor formed on the second insulation layer; a third insulation layer in covering relation to the thin-film resistor and the second insulating layer; first contact holes penetrating the third insulation layer in association with the thin-film resistor; second contact holes penetrating through the second and third insulation layers; and conductive layers for electromagnetically shielding the thin-film resistor, the conductive layers including a first conductive layer formed between the first and second insulation layers below the thin-film resistor and a wiring layers formed above the thin-film resistor within the first and second contact holes.

3 Claims, 1 Drawing Sheet

INTEGRATED CIRCUIT DEVICE

BACKGROUND OF THE INVENTION

This invention relates to an integrated circuit device, and more particularly, is directed to an integrated circuit device having thin film resistors.

Integrated circuit devices are known in which a thinfilm resistor formed of an alloy, such as a chromium (Cr) alloy or a chromium-silicon (Cr—Si) alloy, is provided on a well, an insulation film or the like. However, such conventional integrated circuit devices induce noise caused by crosstalk or the like, because the thin-film resistor is significantly affected by the surrounding electromagnetic field.

SUMMARY OF THE INVENTION

Thus, it is an object of the present invention to provide an integrated circuit device which reduces the effect of the surrounding electromagnetic field.

In accordance with an aspect of the present invention, an integrated circuit device includes a thin-film resistor; and conductive layer means for electromagnetically shielding the thin-film resistor, the conductive layer means being provided above and below the thin-film resistor. Preferably, there are three thin-film resistors wherein first and second ones of the thin-film resistors being dummy resistors. The thin-film resistors are formed from an alloy selected from the group consisting of a chromium alloy and a chromium-silicon alloy.

Further, a first insulation layer is formed on a substrate; a first conductive layer is formed on the insulation layer; a second insulation layer is formed on the first conductive layer as part of the conductive layer means; and the thin-film resistor is formed on the second insulation layer.

Preferably, the first and second insulation layers are each formed from $SiO_2$, and the first conductive layer is formed from molybdenum.

A third insulation layer is in covering relation to the thin-film resistor and the second insulating layer, and first contact holes penetrate the third insulation layer in association with the thin-film resistor. Second contact holes penetrate through the second and third insulation layers.

The conductive layer means includes first wiring layers contacting the thin-film resistor from above through the first contact holes and second wiring layers contacting the first conductive layer through the second contact holes.

In accordance with another aspect of the present invention, an integrated circuit device includes a first insulation layer formed on a substrate; a second insulation layer formed above the first insulation layer; a thin-film resistor formed on the second insulation layer; and conductive layer means for electromagnetically shielding the thin-film resistor, the conductive layer means including a first conductive layer formed between the first and second insulation layers below the thin-film resistor and a second conductive layer formed above the thin-film resistor.

In accordance with still another aspect of the present invention, an integrated circuit device includes a first insulation layer formed on a substrate; a second insulation layer formed above the first insulation layer; a thin-film resistor formed on the second insulation layer; a third insulation layer in covering relation to the thin-film resistor and the second insulating layer; first contact holes penetrating the third insulation layer in association with the thin-film resistor; second contact holes penetrating through the second and third insulation layers; and conductive layer means for electromagnetically shielding the thin-film resistor, the conductive layer means including a first conductive layer formed between the first and second insulation layers below the thin-film resistor and a second conductive layer formed above the thin-film resistor.

The above and other objects, features and advantages of the invention will become readily apparent from the following detailed description thereof which is to be read in connection with the accompanying drawings.

BRIEF DESCRIPTION OF THE DRAWING

FIG. 1(a)–1(c) are illustrative drawings of the configuration of an integrated circuit device according to the present invention in which:

FIG. 1(a) is a plan view thereof;

FIG. 1(b) is a cross-sectional view of the integrated circuit device of FIG. 1(a), taken along line B—B thereof; and FIG. 1(c) is a cross-sectional view of the integrated circuit device of FIG. 1(a), taken along line C—C thereof.

DESCRIPTION OF THE PREFERRED EMBODIMENTS

Figure 1A:
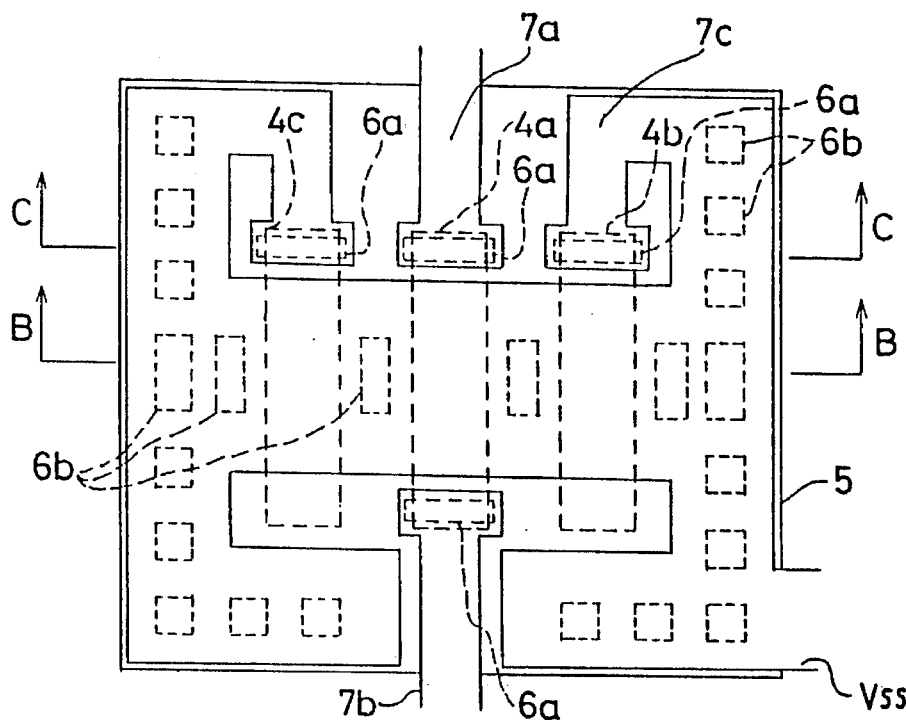

The structure of the integrated circuit device according to the present invention will be described according to the procedure for fabricating it.

As seen in FIG. 1, an $SiO_2$ layer 1 is formed as an insulation layer or a well on the entire surface area of a substrate. Then, a molybdenum (Mo) layer 2 having a thickness of approximately 200 nm is formed on the entire surface area of the $SiO_2$ layer 1. Thereafter, an $SiO_2$ layer 3 having a thickness of approximately 300 nm is formed as an insulation layer on the entire surface area of the Mo-layer 2 by a CVD process.

A chromium (Cr) alloy or a chromium-silicon (Cr—Si) alloy is deposited on layer 3 and has a thickness of approximately 9 nm. Then, an etching process is employed to the Cr or Cr—Si deposit to form thin-film resistors 4a, 4b and 4c. Thin-film resistors 4b and 4c are formed as dummy resistors.

Figure 1B:
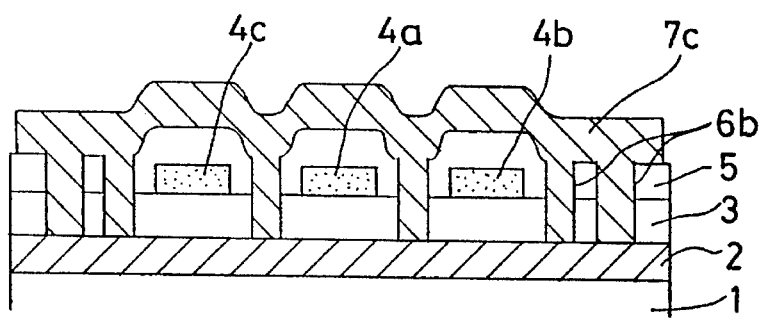
Figure 1C:
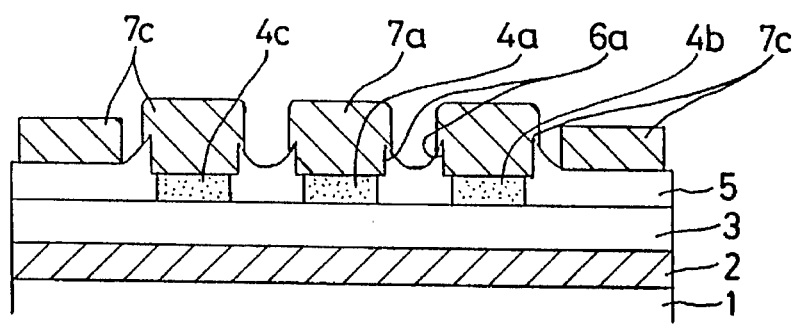

In the next step, an $SiO_2$ layer 5 is formed on the entire surface area over layer 3 and has a thickness of approximately 500 nm. Following this, contact holes 6a are formed, penetrating the $SiO_2$ layer 5, in association with thin-film resistors 4a, 4b and 4c, as shown in FIGS. 1(a) and 1(c), and contact holes 6b are formed, penetrating through the $SiO_2$ layers 3 and 5, as shown in FIGS. 1(a) and 1(b).

On this structure, wiring layers 7a, 7b and 7c which include an aluminum (Al) layer having a thickness of approximately 850 nm are formed. Wiring layers 7a and 7b are connected to both ends of thin-film resistor 4a via contact holes 6a, and are connected to another part (not shown) of the integrated circuit device. Additionally, wiring layer 7c is conductively connected with Mo layer 2 via contact holes 6b and is connected to voltage line Vss.

With the configuration above described, thin-film resistor 4a is electromagnetically shielded by Mo layer 2 and wiring layer 7c, which effectively reduces noise caused by crosstalk or the like.

The installation of conductive layers for electromagnetic shielding above and beneath the thin-film resistor thereby provides an integrated circuit device which reduces the effect of electromagnetic fields.

Having described a specific preferred embodiment of the invention with reference to the accompanying drawings, it will be appreciated that the present invention is not limited to that precise embodiment and that various changes and modifications can be effected therein by one of ordinary skill in the art without departing from the scope or spirit of the invention as defined by the appended claims.

What is claimed is:

1. An integrated circuit device comprising;

a thin-film resistor;

conductive layer means for electromagnetically shielding said thin-film resistor, said conductive layer means being provided above and below said thin-film resistor;

said conductive layer means including a first insulation layer, a first conductive layer formed on said first insulation layer, and a second insulation layer formed on said first conductive layer;

said thin-film resistor being disposed on a portion of said second insulation layer;

said conductive layer means further including a third insulation layer covering said thin-film resistor and areas of said second insulation layer free from contact with said thin-film resistor;

said third insulation layer defining first contact holes providing access to said thin-film resistor through said third insulation layer;

said second and third insulation layers defining second contact holes providing access to said first conductive layers through said second and third insulation layers;

said conductive layer means further including first wiring layers formed in-part on said third insulation layer and in-part contacting said thin-film resistor through said first contact holes and a second wiring layer formed in-part on said third insulation layer and in-part contacting said first conductive layer through said second contact holes; and said second wiring layer including a portion thereof on said third insulation layer and over said thin-film resistor to provide electromagnetic shielding for said thin-film resistor.

2. An integrated circuit comprising:

first and second insulation layers disposed parallel to each other;

a thin-film resistor disposed on a portion of a first side of said second insulation layer furthest from said first insulation layer;

conductive layer means for electromagnetically shielding said thin-film resistor;

said conductive layer means including a first conductive layer interposed between said first and second insulation layers in an area opposite said thin-film resistor disposed on said first side of said second insulation layer;

said conductive layer means including a second conductive layer having said thin-film resistor interposed between said first conductive layer and said second conductive layer;

a third insulation layer interposed between said second conductive layer and said thin-film resistor and in covering contact with said thin-film resistor and said first side of said second insulation layer outside of said portion in contact with said thin-film resistor;

said third insulation layer defining first contact holes extending through said third insulation layer to said thin-film resistor;

said second and third insulation layers defining second contact holes extending through said second and third insulation layers to said first conductive layer; and said second conductive layer including first wiring layers contacting said thin-film resistor through said first contact holes and second wiring layers contacting said first conductive layer through said second contact holes.

3. An integrated circuit device comprising:

a first insulation layer and a second insulation disposed above said first insulation layer;

a thin-film resistor disposed on a portion of a top side of said second insulation layer;

a third insulation layer disposed over said thin-film resistor and said second insulation layer and in covering contact with said thin-film resistor and said top side of said second insulation layer outside of said portion in contact with said thin-film resistor;

said third insulation layer defining first contact holes extending through said third insulation layer to said thin-film resistor;

said second and third insulation layers defining second contact holes extending through said second and third insulation layers to said first conductive layer;

conductive layer means for electromagnetically shielding said thin-film resistor;

said conductive layer means including a first conductive layer interposed between said first and second insulation layers in an area below said thin-film resistor; and said conductive layer means including a second conductive layer disposed above said thin -film resistor and including first wiring layers contacting said thin-film resistor through said first contact holes and second wiring layers contacting said first conductive layer through said second contact holes.

* * * * *